United States Patent
Hall et al.

(10) Patent No.: US 8,951,863 B2
(45) Date of Patent: Feb. 10, 2015

(54) NON-VOLATILE MEMORY (NVM) AND LOGIC INTEGRATION

(71) Applicants: Mark D. Hall, Austin, TX (US); Frank K. Baker, Jr., Austin, TX (US); Mehul D. Shroff, Austin, TX (US)

(72) Inventors: Mark D. Hall, Austin, TX (US); Frank K. Baker, Jr., Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/780,591

(22) Filed: Feb. 28, 2013

(65) Prior Publication Data

US 2013/0267072 A1 Oct. 10, 2013

Related U.S. Application Data

(63) Continuation-in-part of application No. 13/441,426, filed on Apr. 6, 2012.

(51) Int. Cl.
| | | |
|---|---|---|
| *H01L 27/115* | (2006.01) | |
| *H01L 21/82* | (2006.01) | |
| *H01L 29/423* | (2006.01) | |
| *H01L 29/788* | (2006.01) | |

(52) U.S. Cl.
CPC .......... *H01L 21/82* (2013.01); *H01L 27/11534* (2013.01); *H01L 29/42332* (2013.01); *H01L 29/7881* (2013.01); *H01L 29/42328* (2013.01)
USPC .......................................... 438/258; 438/592

(58) Field of Classification Search
USPC ............ 438/258, 592; 257/E21.422, E21.691
See application file for complete search history.

(56) References Cited

U.S. PATENT DOCUMENTS

| | | | |
|---|---|---|---|
| 5,614,746 | A | 3/1997 | Hong et al. |
| 6,087,225 | A | 7/2000 | Bronner et al. |
| 6,194,301 | B1 | 2/2001 | Radens et al. |
| 6,235,574 | B1 | 5/2001 | Tobben et al. |
| 6,333,223 | B1 | 12/2001 | Moriwaki et al. |
| 6,388,294 | B1 | 5/2002 | Radens et al. |
| 6,509,225 | B2 | 1/2003 | Moriwaki et al. |
| 6,531,734 | B1 | 3/2003 | Wu |
| 6,635,526 | B1 | 10/2003 | Malik et al. |
| 6,707,079 | B2 | 3/2004 | Satoh et al. |
| 6,777,761 | B2 | 8/2004 | Clevenger et al. |

(Continued)

FOREIGN PATENT DOCUMENTS

WO 2009058486 5/2009

OTHER PUBLICATIONS

U.S. Appl. No. 13/307,719, filed Nov. 30, 2011.

(Continued)

*Primary Examiner* — George Fourson, III
(74) *Attorney, Agent, or Firm* — Joanna G. Chiu; James L. Clingan, Jr.

(57) ABSTRACT

A method of forming an NVM cell and a logic transistor uses a semiconductor substrate. In an NVM region, a polysilicon select gate of the NVM cell is formed over a first thermally-grown oxygen-containing layer, and in a logic region, a work-function-setting material is formed over a high-k dielectric and a polysilicon dummy gate is formed over the work-function-setting material. Source/drains, a sidewall spacer, and silicided regions of the logic transistor are formed after the first thermally-grown oxygen-containing layer is formed. The polysilicon dummy gate is replaced by a metal gate. The logic transistor is protected while the NVM cell is then formed including forming a charge storage region.

21 Claims, 7 Drawing Sheets

(56) References Cited

U.S. PATENT DOCUMENTS

| | | | |
|---|---|---|---|
| 6,785,165 B2 | 8/2004 | Kawahara et al. | |
| 6,939,767 B2 | 9/2005 | Hoefler et al. | |
| 7,154,779 B2 | 12/2006 | Mokhlesi et al. | |
| 7,183,159 B2 | 2/2007 | Rao et al. | |
| 7,190,022 B2 | 3/2007 | Shum et al. | |
| 7,202,524 B2 | 4/2007 | Kim et al. | |
| 7,208,793 B2 | 4/2007 | Bhattaharyya | |
| 7,256,125 B2 | 8/2007 | Yamada et al. | |
| 7,271,050 B2 | 9/2007 | Hill | |
| 7,365,389 B1 | 4/2008 | Jeon et al. | |
| 7,391,075 B2 | 6/2008 | Jeon et al. | |
| 7,402,493 B2 | 7/2008 | Oh et al. | |
| 7,405,968 B2 | 7/2008 | Mokhlesi et al. | |
| 7,439,134 B1 | 10/2008 | Prinz et al. | |
| 7,476,582 B2 | 1/2009 | Nakagawa et al. | |
| 7,521,314 B2 | 4/2009 | Jawarani et al. | |
| 7,524,719 B2 | 4/2009 | Steimle et al. | |
| 7,544,490 B2 | 6/2009 | Ferrari et al. | |
| 7,544,980 B2 | 6/2009 | Chindalore et al. | |
| 7,544,990 B2 | 6/2009 | Bhattacharyya | |
| 7,560,767 B2 | 7/2009 | Yasuda et al. | |
| 7,745,344 B2 | 6/2010 | Chindalore | |
| 7,795,091 B2 | 9/2010 | Winstead et al. | |
| 7,799,650 B2 | 9/2010 | Bo et al. | |
| 7,816,727 B2 | 10/2010 | Lai et al. | |
| 7,821,055 B2 | 10/2010 | Loiko et al. | |
| 7,906,396 B1 | 3/2011 | Chiang et al. | |
| 7,932,146 B2 | 4/2011 | Chen et al. | |
| 7,989,871 B2 | 8/2011 | Yasuda | |
| 7,999,304 B2 | 8/2011 | Ozawa et al. | |
| 8,017,991 B2 | 9/2011 | Kim et al. | |
| 8,043,951 B2 | 10/2011 | Beugin et al. | |
| 8,063,434 B1 | 11/2011 | Polishchuk et al. | |
| 8,093,128 B2 | 1/2012 | Koutny et al. | |
| 8,138,037 B2 | 3/2012 | Chudzik et al. | |
| 8,168,493 B2 | 5/2012 | Kim | |
| 8,298,885 B2 | 10/2012 | Wei et al. | |
| 8,334,198 B2 | 12/2012 | Chen et al. | |
| 8,372,699 B2 | 2/2013 | Kang et al. | |
| 8,389,365 B2 | 3/2013 | Shroff et al. | |
| 8,399,310 B2 | 3/2013 | Shroff et al. | |
| 8,524,557 B1 | 9/2013 | Hall et al. | |
| 8,536,006 B2 | 9/2013 | Shroff et al. | |
| 8,536,007 B2 | 9/2013 | Shroff et al. | |
| 8,679,927 B2 | 3/2014 | Ramkumar et al. | |
| 8,871,598 B1 | 10/2014 | Perera | |
| 2001/0049166 A1 | 12/2001 | Peschiaroli et al. | |
| 2002/0061616 A1* | 5/2002 | Kim et al. | 438/200 |
| 2003/0022434 A1 | 1/2003 | Taniguchi et al. | |
| 2004/0075133 A1 | 4/2004 | Nakagawa et al. | |
| 2004/0262670 A1 | 12/2004 | Takebuchi et al. | |
| 2005/0145949 A1 | 7/2005 | Sadra et al. | |
| 2006/0038240 A1 | 2/2006 | Tsutsumi et al. | |
| 2006/0046449 A1 | 3/2006 | Liaw | |
| 2006/0099798 A1 | 5/2006 | Nakagawa | |
| 2006/0134864 A1 | 6/2006 | Higashitani et al. | |
| 2006/0211206 A1 | 9/2006 | Rao et al. | |
| 2006/0221688 A1 | 10/2006 | Shukuri et al. | |
| 2007/0037343 A1 | 2/2007 | Colombo et al. | |
| 2007/0077705 A1 | 4/2007 | Prinz et al. | |
| 2007/0115725 A1 | 5/2007 | Pham et al. | |
| 2007/0215917 A1 | 9/2007 | Taniguchi | |
| 2007/0224772 A1 | 9/2007 | Hall et al. | |
| 2007/0249129 A1 | 10/2007 | Hall et al. | |
| 2007/0264776 A1 | 11/2007 | Dong et al. | |
| 2008/0029805 A1 | 2/2008 | Shimamoto et al. | |
| 2008/0050875 A1 | 2/2008 | Moon et al. | |
| 2008/0067599 A1 | 3/2008 | Tsutsumi et al. | |
| 2008/0105945 A1 | 5/2008 | Steimle et al. | |
| 2008/0121983 A1 | 5/2008 | Seong et al. | |
| 2008/0128785 A1 | 6/2008 | Park et al. | |
| 2008/0145985 A1 | 6/2008 | Chi | |
| 2008/0185635 A1 | 8/2008 | Yanagi et al. | |
| 2008/0237690 A1 | 10/2008 | Anezaki et al. | |
| 2008/0237700 A1 | 10/2008 | Kim et al. | |
| 2008/0283900 A1 | 11/2008 | Nakagawa et al. | |
| 2008/0290385 A1 | 11/2008 | Urushido | |
| 2008/0308876 A1 | 12/2008 | Lee et al. | |
| 2009/0050955 A1 | 2/2009 | Akita et al. | |
| 2009/0065845 A1 | 3/2009 | Kim et al. | |
| 2009/0072274 A1 | 3/2009 | Knoefler et al. | |
| 2009/0078986 A1 | 3/2009 | Bach | |
| 2009/0101961 A1 | 4/2009 | He et al. | |
| 2009/0111229 A1 | 4/2009 | Steimle et al. | |
| 2009/0179283 A1 | 7/2009 | Adams et al. | |
| 2009/0225602 A1 | 9/2009 | Sandhu et al. | |
| 2009/0256211 A1 | 10/2009 | Booth, Jr. et al. | |
| 2009/0269893 A1 | 10/2009 | Hashimoto et al. | |
| 2009/0273013 A1 | 11/2009 | Winstead et al. | |
| 2009/0278187 A1 | 11/2009 | Toba | |
| 2011/0031548 A1 | 2/2011 | White et al. | |
| 2011/0095348 A1 | 4/2011 | Chakihara et al. | |
| 2011/0204450 A1 | 8/2011 | Moriya | |
| 2011/0260258 A1 | 10/2011 | Zhu et al. | |
| 2012/0034751 A1 | 2/2012 | Ariyoshi et al. | |
| 2012/0104483 A1 | 5/2012 | Shroff et al. | |
| 2012/0132978 A1 | 5/2012 | Toba et al. | |
| 2012/0142153 A1 | 6/2012 | Jeong | |
| 2012/0248523 A1 | 10/2012 | Shroff et al. | |
| 2012/0252171 A1 | 10/2012 | Shroff et al. | |
| 2013/0026553 A1 | 1/2013 | Horch | |
| 2013/0037886 A1 | 2/2013 | Tsai et al. | |
| 2013/0065366 A1 | 3/2013 | Thomas et al. | |
| 2013/0084684 A1 | 4/2013 | Ishii et al. | |
| 2013/0137227 A1 | 5/2013 | Shroff et al. | |
| 2013/0171785 A1 | 7/2013 | Shroff et al. | |
| 2013/0171786 A1 | 7/2013 | Shroff et al. | |
| 2013/0178027 A1 | 7/2013 | Hall et al. | |
| 2013/0178054 A1 | 7/2013 | Shroff et al. | |
| 2013/0264633 A1 | 10/2013 | Hall et al. | |
| 2013/0264634 A1 | 10/2013 | Hall et al. | |
| 2013/0267072 A1 | 10/2013 | Hall et al. | |
| 2013/0267074 A1 | 10/2013 | Hall et al. | |
| 2013/0323922 A1 | 12/2013 | Shen et al. | |
| 2014/0035027 A1 | 2/2014 | Chakihara et al. | |
| 2014/0050029 A1 | 2/2014 | Kang et al. | |
| 2014/0120713 A1 | 5/2014 | Shroff et al. | |

OTHER PUBLICATIONS

U.S. Appl. No. 13/343,331, filed Jan. 4, 2012.
U.S. Appl. No. 13/491,771, filed Jun. 8, 2012.
U.S. Appl. No. 13/491,760, filed Jun. 8, 2012.
Lee et al.; Theoretical and Experimental Investigation of Si Nanocrystal Memory Device With HfO2 High-k Tunneling Dielectric; IEEE Transactions on Electron Devices; Oct. 2003; pp. 2067-2072; vol. 50, No. 10, IEEE.
Office Action mailed Dec. 24, 2013 in U.S. Appl. No. 13/790,225.
Office Action mailed Dec. 24, 2013 in U.S. Appl. No. 13/790,014.
Office Action mailed Dec. 24, 2013 in U.S. Appl. No. 13/780,574.
Office Action mailed Dec. 31, 2013 in U.S. Appl. No. 13/442,142.
Office Action mailed Jan. 16, 2014 in U.S. Appl. No. 13/491,771.
Office Action mailed Jan. 31, 2014 in U.S. Appl. No. 13/781,727.
Chen, J.H., et al., "Nonvolatile Flash Memory Device Using Ge Nanocrystals Embedded in HfA10 High-k Tunneling and Control Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAIO-SiO2 tunnel layer", Sciencedirect. com, Solid-State Electronics, vol. 61, Issue 1, Jul. 2011, pp. 100-105, http://wwww.sciencedirect.com/science/article/pii/S0038110111000803.
Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1. 4, pp. 634-637.
U.S. Appl. No. 13/781,727, Shroff, M., et al., "Methods of Making Logic Transistors and non-Volatile Memory Cells", Office Action—Restriction, Jun. 21, 2013.

(56) References Cited

OTHER PUBLICATIONS

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

Wang, X.P., et al., Dual Metal Gates with Band-Edge Work Functions on Novel HfLaO High-K Gate Dielectric, IEEE, Symposium on VLSI Technology Digest of Technical Papers, 2006.

U.S. Appl. No. 13/402,426, Hall, M.D., et al., "Non-Volatile Memory Cell and Logic Transistor Integration", Office Action—Allowance—May 3, 2013.

U.S. Appl. No. 13/789,971, Hall, M.D., et al, "Integration Technique Using Thermal Oxide Select Gate Dielectric for Select Gate and Replacement Gate for Logic ", Office Action—Allowance—May 15, 2013.

U. S. Appl. No. 13/491,771, Hall et al , "Integrating Formation of a Replacement Ggate Transistor and a Non-Volatile Memory Cell Using a High-K Dielectric", Office Action—Rejection, Sep. 9, 2013.

U.S. Appl. No. 13/442,142, Hall, M.D., et al., "Logic Transistor and Non-Volatile Memory Cell Integration", Office Action—Ex Parte Quayle, Apr. 4, 2013.

U.S. Appl. No. 13/442,142, Hall, M.D., et al., "Logic Transistor and Non-Volatile Memory Cell Integration", Office Action—Allowance, Aug. 2, 2013.

U.S. Appl. No. 13/907,491, Hall, M.D., et al., "Logic Transistor and Non-Volatile Memory Cell Integration", Office Action—Rejection, Sep. 13, 2013.

U.S. Appl. No. 12/915,726, Shroff, M., et al., "Non-Volatile Memory and Logic Circuit Process Integration", Office Action—Restriction, Jul. 31, 2012.

U.S. Appl. No. 12/915,726, Shroff, M., et al., "Non-Volatile Memory and Logic Circuit Process Integration", Office Action—Allowance, Dec. 10, 2012.

U.S. Appl. No. 13/781,727, Shroff, M., et al., "Methods of Making Logic Transistors and non-Volatile Memory Cells", Office Action—Rejection, Aug. 22, 2013.

U.S. Appl. No. 13/077,491, Shroff, M.., et al., "Non-Volatile Memory and Logic Circuit Process Integration", Office Action—Rejection, Aug. 15, 2012.

U.S. Appl. No. 13/077,491, Shroff, M.., et al., "Non-Volatile Memory and Logic Circuit Process Integration", Office Action—Rejection, Feb. 6, 2013.

U.S. Appl. No. 13/077,491, Shroff, M.., et al., "Non-Volatile Memory and Logic Circuit Process Integration", Office Action—Allowance, Jun. 18, 2013.

U.S. Appl. No. 13/077,501, Shroff, M.., et al., "Non-Volatile Memory and Logic Circuit Process Integration", Office Action—Allowance, Nov. 26, 2012.

U.S. Appl. No. 13/313,179, Shroff, M., et al., "Method of Protecting Against Via Failure and Structure Therefor", Office Action—Rejection, Aug. 15, 2013.

U.S. Appl. No. 13/307,719, Shroff, M., et al., "Logic and Non-Volatile Memory (NVM) Integration", Office Action—Allowance, May 29, 2013.

U.S. Appl. No. 13/343,331, Shroff, M., et al., "Non-Volatile Memory (NVM) and Logic Integration", Office Action—Rejection, Mar. 13, 2013.

U.S. Appl. No. 13/343,331, Shroff, M., et al., "Non-Volatile Memory (NVM) and Logic Integration", Office Action—Allowance, Jun. 24, 2013.

U.S. Appl. No. 13/441,426, Shroff, M., et al., "Non-Volatile Memory (NVM) and Logic Integration", Office Action—Allowance, Sep. 9, 2013.

U.S. Appl. No. 13/780,574, Hall, M.D., et al., Non-Volatile Memory (NVM) and Logic Integration, Office Action—Allowance, Sep. 6, 2013.

U.S. Appl. No. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.

U.S. Appl. No. 13/780,591, Hall, M.D., et al., "Non-Volatile Memory (NVM) and Logic Integration", filed Feb. 28, 2013.

U.S. Appl. No. 13/661,157, Shroff, M.D., et al., "Method of Making a Logic Transistor and a Non-Volatile Memory (NVM) Cell", filed Oct. 26, 2012.

U.S. Appl. No. 13/780,591, Hall, M.D., et al., "Non-Volatile Memory (NVM) and Logic Integration", Office Action—Allowance Nov. 22, 2013.

U.S. Appl. No. 13/343,331, Shroff, M., et al., "Non-Volatile Memory (NVM) and Logic Integration", Office Action—Allowance, Nov. 8, 2013.

U.S. Appl. No. 13/441,426, Shroff, M., et al., "Non-Volatile Memory (NVM) and Logic Integration", Office Action—Allowance, Feb. 21, 2014.

U.S. Appl. No. 13/442,142, Hall, M.D., et al., "Logic Transistor and Non-Volatile Memory Cell Integration", Office Action—Allowance, Feb. 28, 2014.

U.S. Appl. No. 13/790,014, Hall, M., et al., "Integrating Formation of a Logic Transistor and a Non-Volatile Memory Cell Using a Partial Replacement Gate Technique", Office Action—Allowance, mailed Mar. 3, 2014.

U.S. Appl. No. 13/491,771, Hall et al., Integrating Formation of a Replacement Gate Transistor and a Non-Volatile Memory Cell Using a High-K Dielectric', Office Action—Allowance, mailed Mar. 6, 2014.

U.S. Appl. No. 13/907,491, Hall et al., "Logic Transistor and Non-Volatile Memory Cell Integration", Office Action—Allowance, mailed Mar. 11, 2014.

U.S. Appl. No. 13/790,225, Hall et al., "Integrating Formation of a Replacement Gate Transistor and a Non-Volatile Memory Cell Having Thin Film Storage", Office Action—Allowance, mailed Mar. 12, 2014.

U.S. Appl. No. 13/343,331, Shroff et al., "Non-Volatile Memory (NVM) and Logic Integration", Office Action—Allowance, mailed Jun. 24, 2013.

U.S. Appl. No. 13/928,666, Office Action—Rejection, Jul. 23, 2014.

U.S. Appl. No. 13/781,727, Shroff, M. D., et al., Office Action—Allowance, mailed May 12, 2014.

U.S. Appl. No. 13/907,491, Office Action—Rejection, Sep. 3, 2013.

U.S. Appl. No. 13/441,426, Shroff, M. D., et al., Office Action—Allowance, mailed Jun. 9, 2014.

U.S. Appl. No. 14/041,662, Office Action—Restriction, mailed Aug. 1, 2014.

U.S. Appl. No. 13/969,180, Perera, Office Action—Allowance, mailed Aug. 5, 2014.

U.S. Appl. No. 13/781,727, Shroff, Office Action—Allowance, mailed Aug. 15, 2014.

U.S. Appl. No. 13/955,665, Office Action—Allowance, mailed Aug. 20, 2014.

U.S. Appl. No. 13/973,549, Hong, Office Action—Restriction, mailed Aug. 26, 2014.

U.S. Appl. No. 13/441,426, Shroff, Office Action—Allowance, mailed Sep. 26, 2014.

U.S. Appl. No. 13/661,157, Office Action—Restriction, mailed Oct. 2, 2014.

U.S. Appl. No. 14/041,662, Perera, Office Action—Allowance, mailed Oct. 17, 2014.

U.S. Appl. No. 13/973,549, Office Action—Allowance, mailed Nov. 14, 2014.

\* cited by examiner

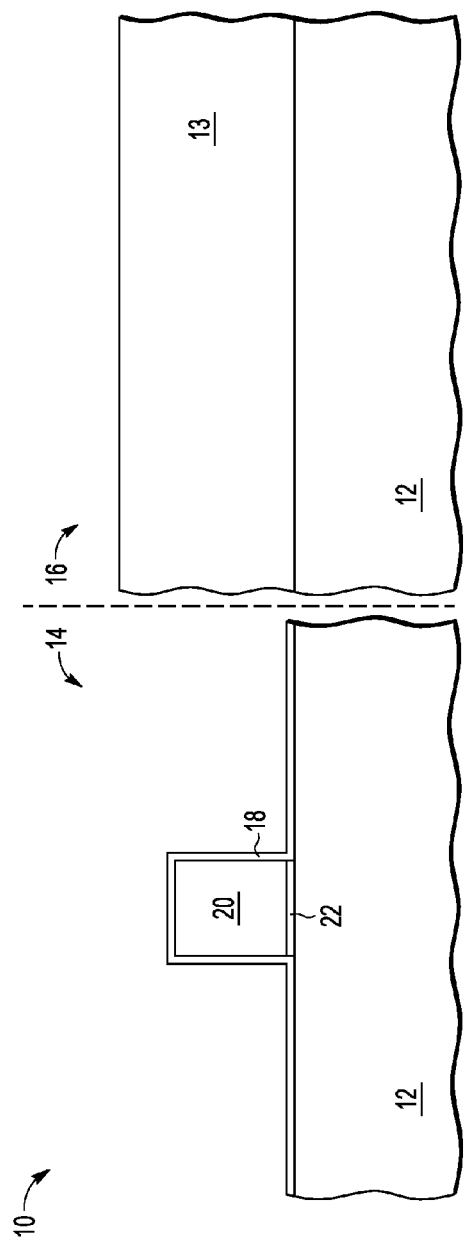
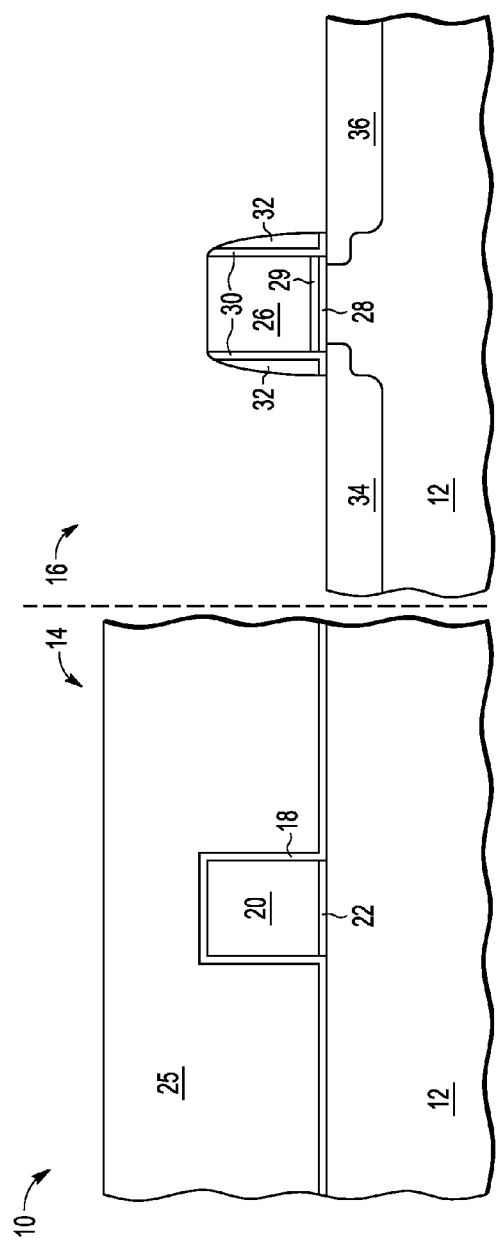

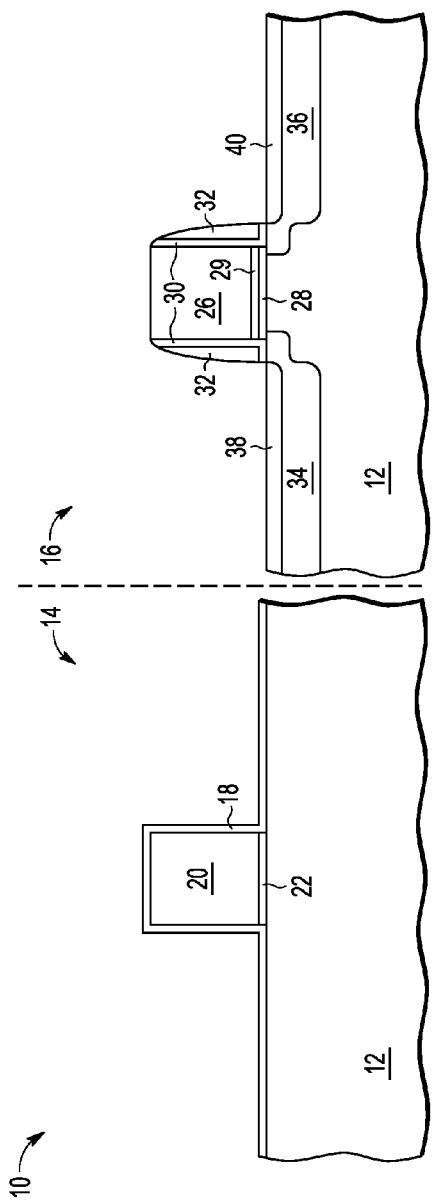
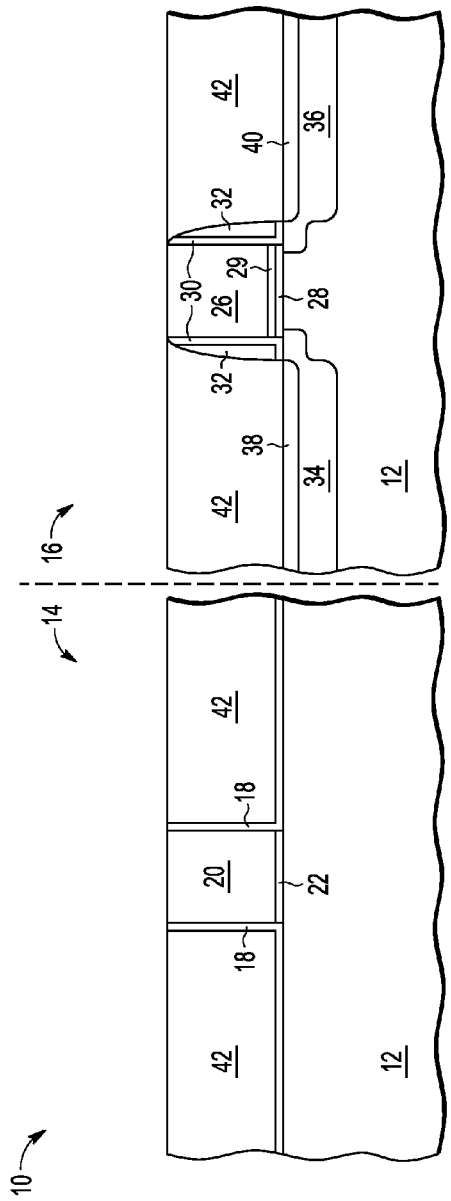

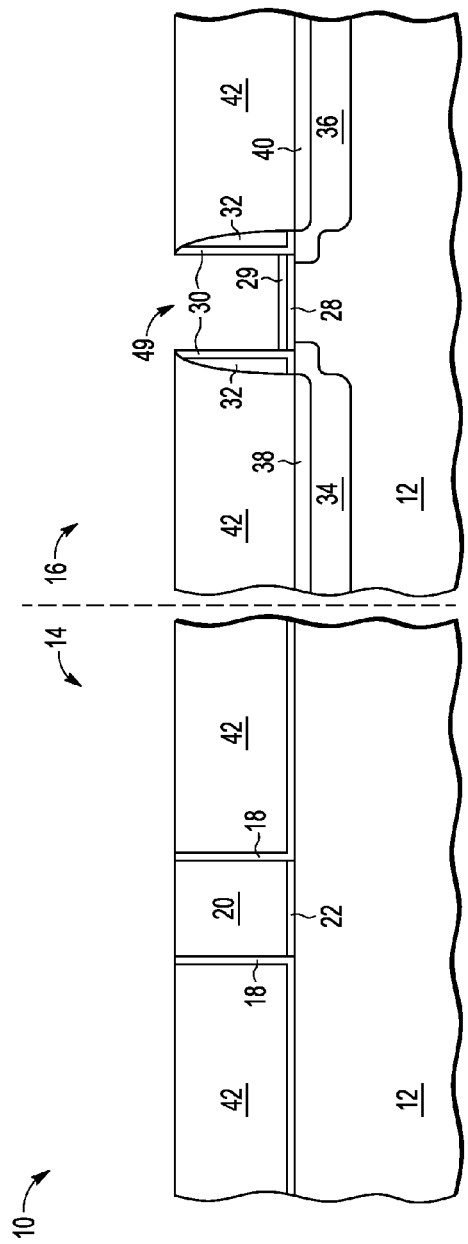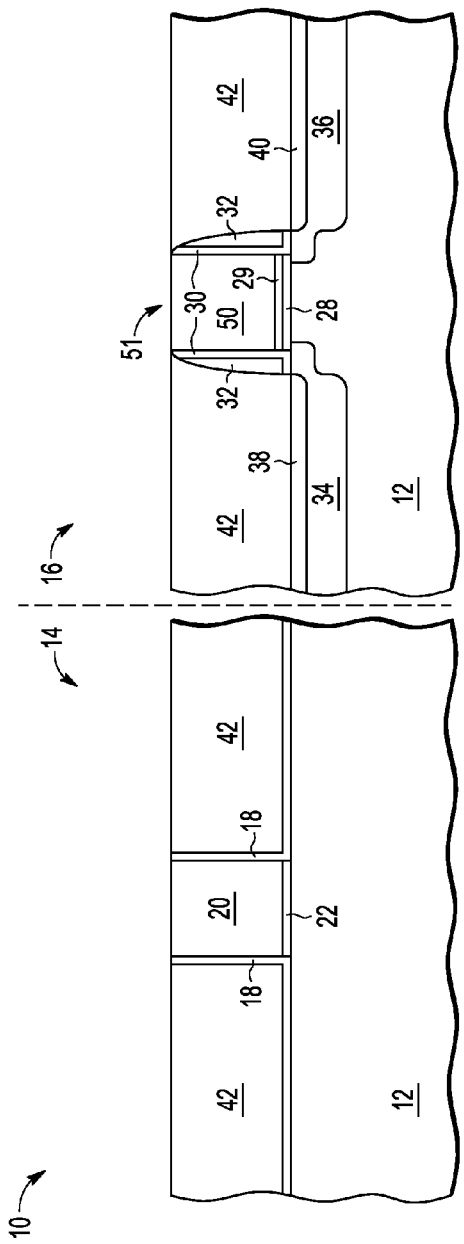

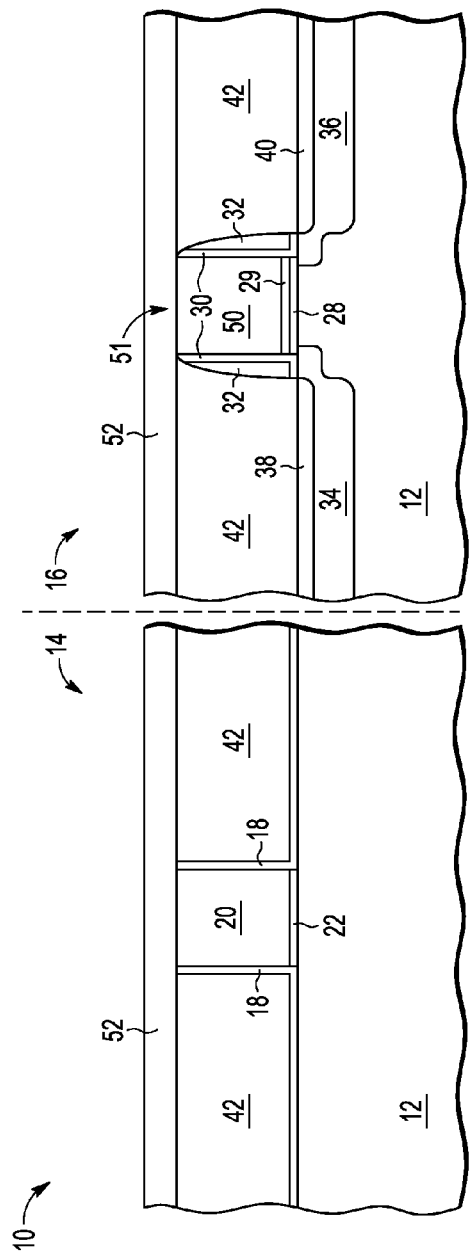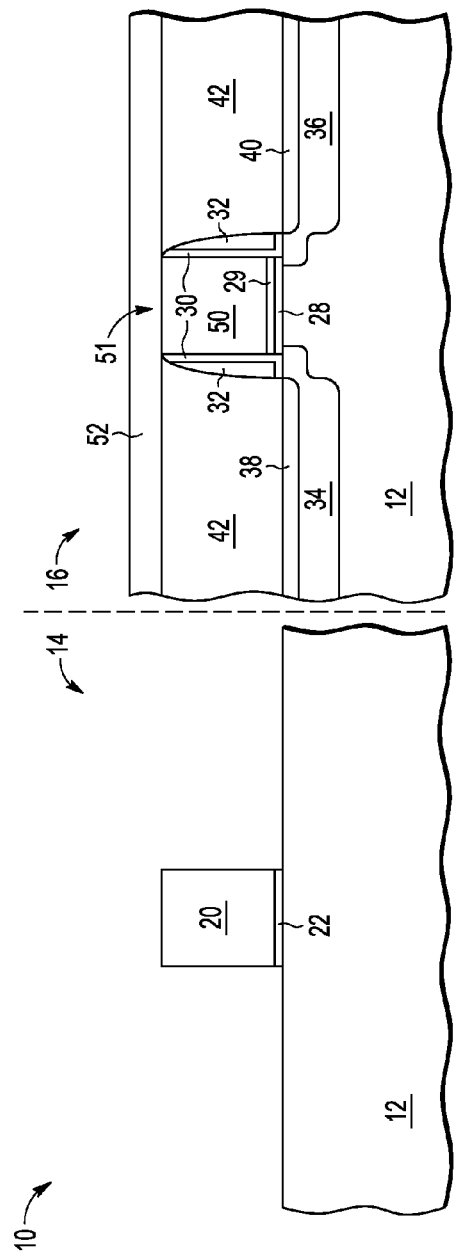

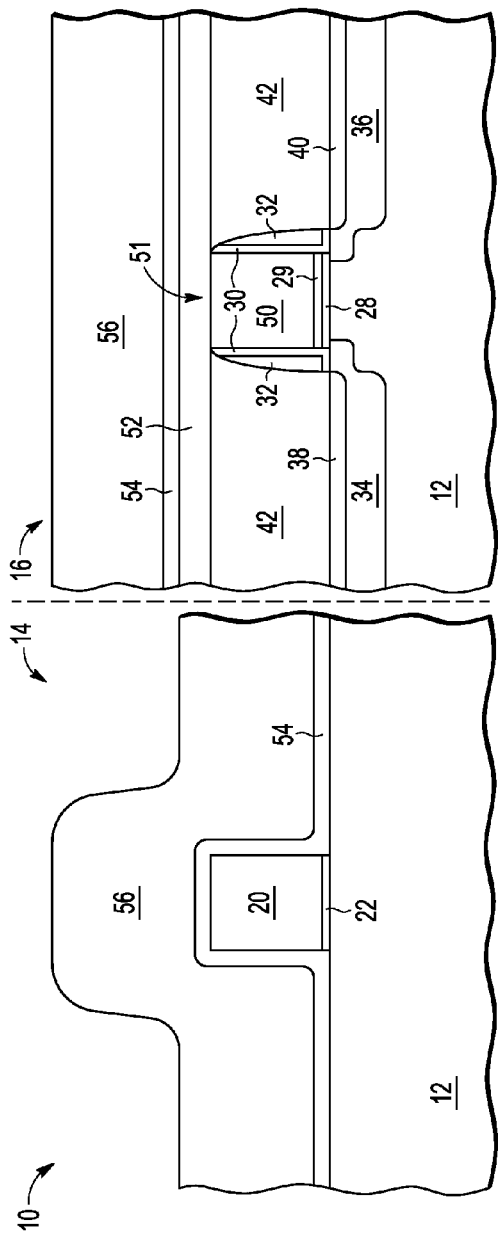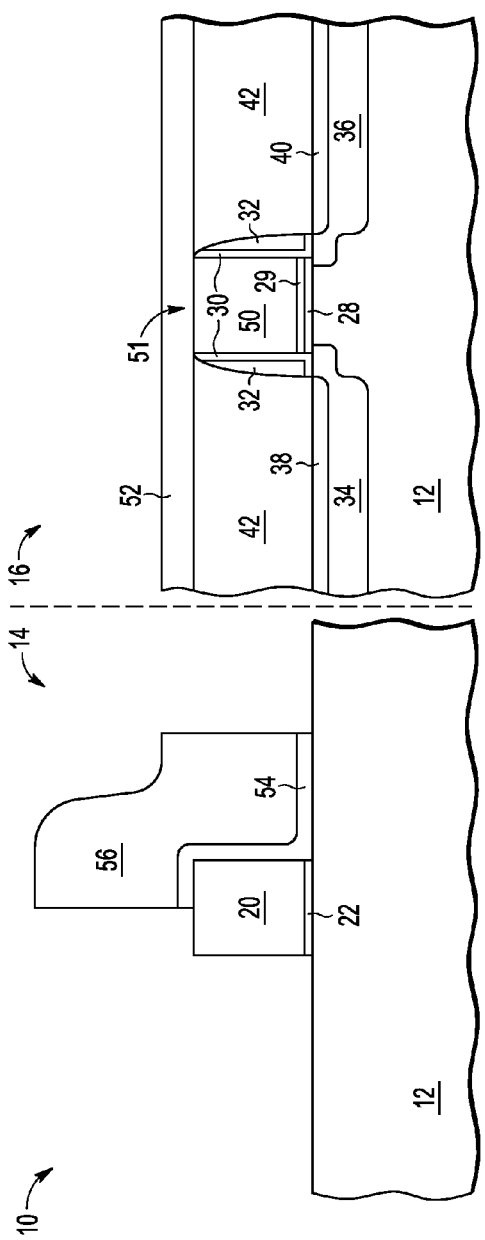

NON-VOLATILE MEMORY (NVM) AND LOGIC INTEGRATION

CROSS-REFERENCE TO RELATED APPLICATION(S)

This application is continuation-in-part of U.S. patent application Ser. No. 13/441,426, filed on Apr. 6, 2012, entitled "Non-Volatile Memory (NVM) and Logic Integration," naming Mehul D. Shroff and Mark D. Hall as inventors, and assigned to the current assignee hereof, and which is hereby incorporated by reference. This application is related to U.S. patent application Ser. No. 13/780,574, filed on event date, entitled "Non-Volatile Memory (NVM) and Logic Integration," naming Mark D. Hall, Mehul D. Shroff, and Frank K. Baker as inventors, and assigned to the current assignee hereof.

BACKGROUND

1. Field

The invention relates to non-volatile memories (NVMs), and more particularly, to NVMs integrated with logic devices.

2. Related Art

Non-volatile memories (NVMs) are often on an integrated circuit which also performs other functions. In such cases it is undesirable to sacrifice logic performance in favor of performance of the NVM. Also it is important to avoid or minimize additional cost in achieving high performance for both the logic and the NVM.

Accordingly there is a need to provide further improvement in achieving high performance while also addressing cost increase issues in integrated circuits that have both NVM and logic.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a cross section of a semiconductor device at a stage in processing according to an embodiment;

FIG. 2 is a cross section of the semiconductor device of FIG. 1 at a subsequent stage in processing;

FIG. 3 is a cross section of the semiconductor device of FIG. 2 at a subsequent stage in processing;

FIG. 4 is a cross section of the semiconductor device of FIG. 3 at a subsequent stage in processing;

FIG. 5 is a cross section of the semiconductor device of FIG. 4 at a subsequent stage in processing;

FIG. 6 is a cross section of the semiconductor device of FIG. 5 at a subsequent stage in processing;

FIG. 7 is a cross section of the semiconductor device of FIG. 6 at a subsequent stage in processing;

FIG. 8 is a cross section of the semiconductor device of FIG. 7 at a subsequent stage in processing;

FIG. 9 is a cross section of the semiconductor device of FIG. 8 at a subsequent stage in processing;

FIG. 10 is a cross section of the semiconductor device of FIG. 9 at a subsequent stage in processing.

DETAILED DESCRIPTION

Figure 11:
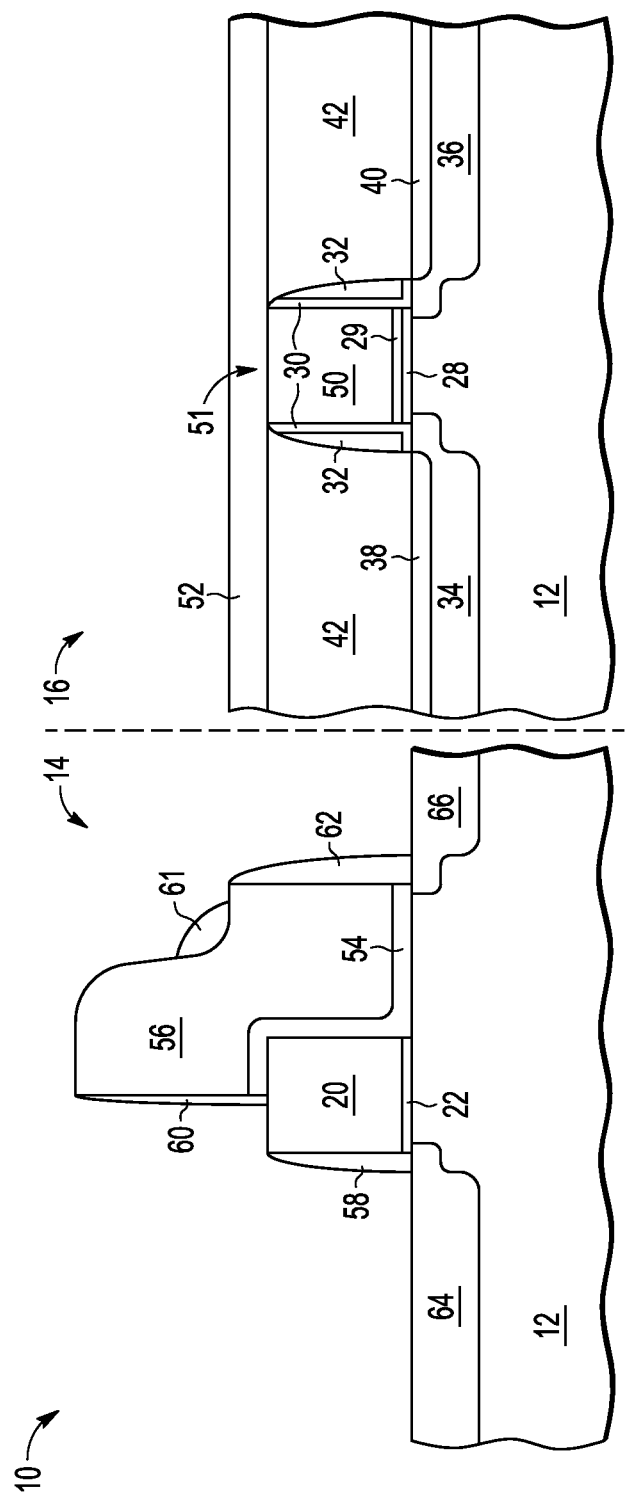
FIG. 11 is a cross section of the semiconductor device of FIG. 10 at a subsequent stage in processing.

A non-volatile memory (NVM) cell is made contemporaneously with logic transistors. This can be done with high-k gate dielectrics and metal gates in the logic region, and thermally grown oxygen containing dielectrics, polysilicon select gates, and metal nanocrystals in the NVM region. In one embodiment, a replacement gate process replaces a top portion (referred to as a dummy portion) of the gate electrode of the logic transistor, while the high-k gate dielectric and a barrier metal (a work-function-setting metal) remain in place. The barrier metal protects the high-k gate dielectric during subsequent processing. The source/drain junctions and silicide for the logic transistor source/drain regions are formed prior to replacement of the dummy portion of the gate in the logic region. After replacement of the dummy portion of the gate with the actual top portion of the logic gate, the dielectric layer surrounding the select gate is removed from the NVM areas (while being maintained around the logic gate in the logic areas), after which, the charge storage layer and control gate are formed. Furthermore, the source/drain regions and silicidation for the NVM cells can be completed while the logic areas remain protected. This is better understood by reference to the drawings and the following written description.

Shown in FIG. 1 is a semiconductor device 10 having a substrate 12. Semiconductor device 10 is divided into an NVM region 14 and a logic region 16. NVM region 14 is for forming an NVM cell which, in this described example, is an N-channel NVM cell. Logic region 16 is for forming a logic transistor of the same doping type as the NVM cell and may be referenced as an N-channel region because the NVM cell being formed is N-channel. Note that alternatively, logic region 16 may be used for forming a P-channel transistor or forming both N-channel and P-channel transistors. Semiconductor device 10 includes a protection layer 13 over substrate 12 in logic region 16 to protect substrate 12 during processing performed in NVM region 14. For example, protection layer 13 may be an oxide or a nitride layer. Semiconductor device 10 includes a thermally grown oxygen-containing gate dielectric 22 over substrate 12 in NVM region 14, and a polysilicon gate 20 over gate dielectric 22. Gate dielectric 22 and gate 20 may be formed by first thermally growing an oxygen-containing dielectric layer over substrate 12 in NVM region 14, and then blanket depositing a polysilicon layer over the thermally grown oxygen-containing layer. The polysilicon layer and oxygen-containing dielectric layer may then be patterned to form gate dielectrics and gates in NVM region 14, such as gate dielectric 22 and gate 20. A liner layer 18 may then be formed over gate 20 and substrate 12 in NVM region 14. In one embodiment, liner layer 18 is a blanket deposited oxide layer. In an alternate embodiment, liner layer 18 may not be present. Afterwards, protection layer 13 is removed from logic region 16. Note that any blanket deposited layers will also be formed over protection layer 13; however, they are removed from logic region 16 when protection layer 13 is removed.

Shown in FIG. 2 is semiconductor device 10 after protection layer 13 has been removed from logic region 16 and a protection layer 25 has been formed over gate 20 and gate dielectric 22 to protect NVM region 14 during processing performed in logic region 16. for example, protection layer 25 may be an oxide or a nitride layer. Semiconductor device 10 includes a high-k gate dielectric 28 over substrate 12 in logic region 16, and a barrier layer 29 over high-k gate dielectric 28, and a dummy portion 26 over barrier layer 29. High-k dielectric 28, barrier layer 29, and dummy portion 26 may be formed by first blanket depositing a high-k dielectric layer over substrate 12, then blanket depositing a barrier layer (which may be a metal layer), and then blanket depositing a dummy layer (which may be, for example, a polysilicon layer or a nitride layer). The dielectric, barrier, and dummy layers may then be patterned to form the gate dielectrics, barrier layers, and dummy portions in logic region 16, such as gate dielectric 28, barrier layer 29, and dummy portion 26. (Note that dummy potion 26 may also be referred to as a dummy gate.)

High-k gate dielectric 28 may be an oxide of a metal, such as, for example, hafnium oxide, lanthanum oxide, aluminum oxide, and tantalum oxide. Also, high-k gate dielectric 28 may additionally include a thin buffer oxide layer. In one embodiment, a high-k gate dielectric has a dielectric constant of greater than or equal to 7. Barrier layer 29 may include a metal that is chosen for its effectiveness in setting the work function of the transistor. For example, in the case of an N-channel transistor or NVM cell, the metal may be tantalum carbide or lanthanum. In the case of a P-channel transistor, the metal may be molybdenum or titanium nitride. Note that since barrier layer 29 operates to set the work function of the device, it may also be referred to as a work-function-setting material or layer.

After formation of the gate dielectric, barrier layer, and dummy portion, protection layer 25 protects NVM region 14 while shallow implants are formed into substrate 12 in logic region 16 to form source/drain extension regions extending laterally from the sidewalls of barrier layer 29 and dummy portion 26. After formation of the extension regions, a liner layer is formed over protection layer 25 and dummy portion 26, and a spacer layer is formed over the liner layer. In one embodiment, the liner layer is an oxide layer and the spacer layer is a nitride layer. An anisotropic etch is then performed in logic region 16 to form a spacer liner 30 from the liner layer and sidewall spacer 32 from the spacer layer. During this anisotropic etch, protection layer 25 protects NVM region 14. Spacer liner 30 and spacer 32 surround high-k dielectric 28, barrier layer 29, and dummy portion 26. After formation of spacer 32, while NVM region 14 remains protected by protection layer 25, deep implants may be performed to form source/drain regions 34 and 36 in substrate 12, adjacent sidewalls of high-k dielectric 28, barrier layer 29 and dummy portion 26. Note that source/drain regions 34 and 36 include the extension regions previously formed which extend slightly under dummy portion 26.

Note that thermally grown oxygen—containing gate dielectric 22 is formed prior to the formation of high-k gate dielectric 28. In this manner, the higher heat requirements for forming a thermally grown oxygen-containing layer for gate dielectric 22 do not damage the high-k gate dielectrics of logic region 16 (such as high-k gate dielectric 28). Note that a thermally grown oxygen-containing layer allows for a higher quality gate dielectric as compared to a deposited oxygen-containing layer. However, the temperatures required for thermally growing such an oxygen-containing layer may damage existing high-k dielectric layers. For example, in one embodiment, the thermal growth of an oxygen-containing layer is performed at a temperature of greater than 800 degrees Celsius, greater than 900 degrees Celsius, or even greater than 1000 degrees Celsius, whereas a high-k dielectric layer may be damaged upon being exposed to a temperature of greater than 600 degrees Celsius or 700 degrees Celsius. While it may be possible that a high-k dielectric layer may be able to see a maximum temperature of 900 degrees Celsius without damage, some embodiments require a temperature of greater than 900 degrees Celsius for thermally growing an oxygen-containing layer. Therefore, by forming the logic gates in logic region 16 after formation of the thermally grown oxygen-containing gate dielectrics of the NVM cells in NVM region 14, high-k gate dielectrics can be used for the logic devices in logic region 16 without exposing them to the damaging high temperatures required during the formation of the gate dielectrics in NVM region 14.

Shown in FIG. 3 is semiconductor device 10 after forming silicide regions 38 and 40. Substrate 12, in logic region 16, is silicided to form silicide regions 38 and 40. (Note that if dummy portion 26 is polysilicon, a silicide region would also be formed on the top of dummy portion 26 which will later get removed. Alternatively, the dummy portion can be protected from silicidation by deposition of a protection layer following the polysilicon deposition.) During the silicidation in logic region 16, protection layer 25 protects NVM region 14 such that no silicide regions are formed in NVM region 14. After formation of the silicide regions, protection layer 25 is removed. Note also that dummy portion 26 and barrier layer 29 protect high-k gate dielectric 28 during formation of source/drain regions 34 and 36 and silicide regions 38 and 40. In this manner, high-k gate dielectrics can be formed early in the process integration and need not be replaced later as part of the gate replacement process.

Shown in FIG. 4 is semiconductor device 10 after depositing an interlevel dielectric (ILD) layer 42 and performing a chemical mechanical polish (CMP) to expose top surfaces of gate 20 and dummy portion 26. In the illustrated embodiment of FIG. 4, a top surface of ILD 42 in NVM Region 14 is substantially aligned with a top surface of gate 20, and ILD 42 has an opening in which gate 20 is formed. Also, a top surface of ILD 42 in logic region 16 is substantially aligned with a top surface of dummy portion 26, and ILD 42 has an opening in which dummy portion 26 is present.

Shown in FIG. 5 is semiconductor device 10 after removal of dummy portion 26. Removal of dummy portion 26 creates opening 49 in ILD 42 and exposes barrier layer 29. In one embodiment, dummy portion 26 may be removed by a conventional plasma etch process utilizing halogens such as chlorine and/or bromine. Note that barrier layer 29 and high-k gate dielectric 28 remain in place such that only a portion of the gate stack of the devices is involved in the gate replacement process. (Note that if a silicide region was formed on the top of dummy portion 26 during silicidation, these silicide regions can either be removed with the previous CMP described in reference to FIG. 4, or with the removal of dummy portion 26 described in reference to FIG. 5.) Also, note that while dummy portion 26 is removed, gate 20 and gate dielectric 22 remain in place. Therefore, a protection layer may be formed over ILD 42 and gate 20 in NVM region 14 to protect gate 20 during the removal of dummy portion 26. The protection layer may then subsequently be removed. Alternatively, NVM region 14 could be protected with photoresist during this step.

Shown in FIG. 6 is semiconductor device 10 after formation of a gate layer within opening 49 created by the removal of dummy portion 26. After removal of dummy portion 26, a gate layer is formed over ILD 42 and over barrier layer 29 within opening 49 in ILD 42. A CMP is then performed to remove regions of the gate layer from over ILD 42 such that the gate layer remains only within the openings of ILD 42. Therefore, within each opening (e.g. opening 49) in ILD 42 in logic region 16, a gate portion 50 is formed on barrier layer 29, between sidewalls of ILD 42. Therefore, note that a top surface of ILD 42 is substantially aligned with a top surface of each of gate 20 and gate portion 50.

The gate layer, and therefore gate portion 50, may include one or more layers (such as one or more metals) on the barrier layer, where the top most metal of the gate portion may be referred to as the top metal. Examples of the additional metal include aluminum, tungsten, tungsten nitride, and tantalum nitride. Many other metals may also be used. The gate portion may also include polysilicon that is silicided with metals such as, for example, nickel or cobalt. Gate portion 50 may also be a single layer of the same metal as the barrier layer. Note that the gate stack of each device in logic region 16 refers to the combination of the barrier layer and gate portion. Therefore, gate stack 51 in logic region 16 includes barrier layer 29 and gate portion 50. Note that gate portion 50 may also be referred to as the metal logic gate.

Gate stack 51 may also be referred to as a replacement gate or an actual gate, in which gate stack 51 is formed using a replacement gate process and remains as part of semiconductor device 10 upon completion. Gate 20 corresponds to the select gate of an NVM cell being formed in NVM region 14 and may therefore also be referred to as select gate 20. Gate stack 51 corresponds to the gate of a logic transistor being formed in logic region 16 and may therefore also be referred to as logic gate 51.

Shown in FIG. 7 is semiconductor device 10 after forming a hard mask layer 52 in regions 14 and 16, over ILD 42 and over gate 20 and gate stack 51. In one embodiment, hard mask layer 52 may be nitride. The hard mask layer also functions as an etch-stop layer.

Shown in FIG. 8 is semiconductor device 10 after patterning ILD 42 and hard mask layer 52 to remove ILD 42 and hard mask layer 52 from NVM region 14. Note that ILD 42 and hard mask layer 52 remain in logic region 16.

Shown in FIG. 9 is semiconductor device 10 after depositing a charge storage layer 54 that is for use as a charge storage layer of the NVM cell being formed in NVM region 14. Charge storage layer 54 is formed over gate 20 and substrate 12 in NVM region 14 and over hard mask layer 52 in logic region 16. A gate stack layer 56 is deposited over charge storage layer 54. Gate stack layer 56 may be a stack of conductive layers including one or more metal layers or a single metal layer. Gate stack layer 56 is for use as a control gate of the NVM cell being formed in NVM region 14 and may also be referred to as a control gate layer. Charge storage layer 54 is preferably formed of metal nanocrystals that are formed on a first high-k dielectric layer. A second high-k dielectric layer is formed over and between the metal nanocrystals. Note that the first high-k dielectric layer may be referred to as a base or tunneling dielectric layer, and the second high-k dielectric layer as a fill or blocking dielectric layer which is formed around and over the metal nanocrystals. In an alternate embodiment, charge storage layer 54 may be made of silicon. For example, silicon nanocrystals may be used rather than metal nanocrystals. In some embodiments, metal nanocrystals may be more desirable because of lower overall heat during nanocrystal formation and improved data retention for the NVM cell. Also, in one embodiment, charge storage layer 54 may include a conductive barrier layer as a top layer which prevents the top dielectric of charge storage layer 54 from coming into contact with any photoresist subsequently formed on charge storage layer 54.

Shown in FIG. 10 is semiconductor device 10 after patterning gate stack layer 56 to remove gate stack layer 56 from logic region 16 and to form a control gate in NVM region 14. Therefore, control gate 56 overlaps a sidewall of select gate 20. After patterning gate stack layer 56 in NVM region 14, charge storage layer 54 is etched to leave a remaining portion of charge storage layer 54 aligned to control gate 56.

Shown in FIG. 11 is semiconductor device 10 after formation of source/drain regions 64 and 66 and sidewall spacers 58, 60, 61, and 62 adjacent an exposed sidewall of select gate 20 and adjacent sidewalls of control gate 56. In one embodiment, shallow implants are performed to first form extension regions in substrate 12 which laterally extend from each of the exposed sidewall of select gate 20 and the sidewall of control gate 56 that is over substrate 12 and laterally spaced apart from select gate 20. After formation of the extension regions, sidewall spacers 58, 60, 61, and 62 may be formed. The spacers may include a liner layer between the spacers and the select and control gates. This may be achieved by conformally depositing nitride and performing an anisotropic etch. After formation of the sidewall spacers, deep implants may be performed to form source/drain regions 64 and 66 in substrate 12 which laterally extend from each of the exposed sidewall of select gate 20 and the sidewall of control gate 56 that is laterally spaced apart from select gate 20. Therefore, note that source/drain regions 64 and 66 may include the previously formed extension regions.

Figure 12:
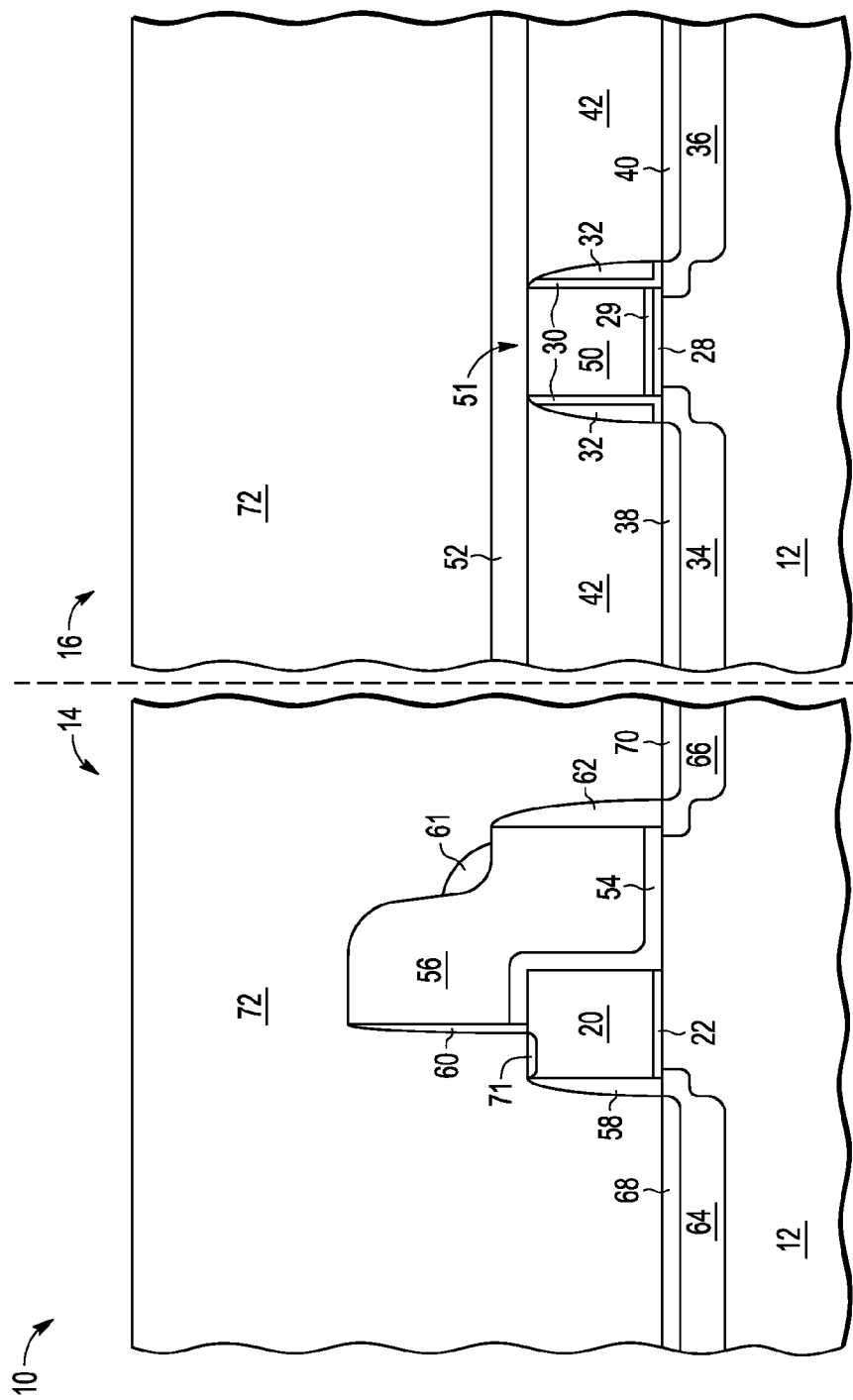
FIG. 12 is a cross section of the semiconductor device of FIG. 11 at a subsequent stage in processing.

Shown in FIG. 12 is semiconductor device 10 after formation of silicide regions 68 and 70 on source/drain regions 64 and 66, respectively, and silicide region 71 on exposed portions of select gate 20 in NVM region 14 and formation and subsequent planarization of an ILD 72 in NVM region 14 and logic region 16. During silicidation to form silicide regions 68, 70, and 71, hard mask layer 52 protects logic region 16. ILD 72 is then formed over the NVM cells in NVM region 14 (e.g. over select gate 20 and control gate 56) and over hard mask layer 52 in logic region 16.

Note that in the illustrated embodiment, source/drain regions 64 and 66 are not formed at the same processing stage as source/drain regions 34 and 36, prior to deposition of ILD 42. Instead, they are formed later in processing. That is, they are formed after formation of the actual (i.e. replacement) top gate portion and after removal of ILD 42. The second ILD, ILD 72, is then formed over substrate 12, source/drain regions 64 and 66, select gate 20 and control gate 56.

Thus is shown an efficient manufacturing process for forming NVM cells and logic transistors that allows for high performance materials in the logic transistors while allowing for the use of a high quality thermally grown oxygen-containing gate dielectric and polysilicon select gate in the NVM region. Note that the high-k materials in the logic region are protected by the barrier layers during subsequent processing. In this manner, the high-k gate dielectrics and barrier layers of the logic gates need not be replaced as part of the gate replacement process. That is, only a top portion of the gate stack is a dummy portion which is replaced with an actual portion. Furthermore, since the thermally grown oxygen-containing gate dielectric is performed prior to formation of the high-k materials in the logic region, the high-k materials are not exposed to the high temperatures used for thermally growing the oxygen-containing gate dielectric.

Although the invention is described herein with reference to specific embodiments, various modifications and changes can be made without departing from the scope of the present invention as set forth in the claims below. For example, different gate stacks may be formed using the replacement gate process for different types of devices which may be integrated with NVM split gate devices. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of forming an NVM cell and a logic transistor using a semiconductor substrate, the method includes: in a non-volatile memory (NVM) region, forming over the semiconductor substrate a first thermally-grown oxygen-containing layer, a select gate of a first material, and a first dielectric layer, wherein the select gate is on the first thermally-grown oxygen-containing layer, a top surface of the first dielectric layer is substantially aligned with a top surface of the select gate, and the first dielectric layer has a first opening in which the select gate is present in the first opening; in a logic region, after forming the first thermally-grown oxygen-containing layer, forming over the semiconductor substrate a high-k dielectric layer, a work-function-setting layer over the high-k dielectric layer, a dummy gate on the work-function-setting layer, source/drains in the semiconductor substrate, a sidewall spacer around the dummy gate, and a second dielectric layer, wherein a top surface of the second dielectric layer is substantially aligned with a top surface of the dummy gate, and the second dielectric layer has a second opening in which the dummy gate is present in the second opening; replacing the dummy gate with a metal gate; removing the first dielectric layer in the NVM region while leaving the second dielectric layer in the logic region; forming a charge storage layer over the NVM region including over the select gate; forming a conductive layer over the charge storage layer; etching the conductive layer to form a control gate; and etching the charge storage layer to leave a remaining portion of the charge storage layer aligned to the control gate. Item 2 includes the method of item 1, wherein: the forming the charge storage layer is further characterized by forming nanocrystals over the second dielectric layer and the metal gate; and the etching the charge storage layer is further characterized by removing the charge storage layer over the second dielectric layer and the metal gate. Item 3 includes the method of item 2, wherein: the step of forming the conductive layer is further characterized by forming the conductive layer over the logic region; and the step of patterning the conductive layer is further characterized by removing the conductive layer over the logic region. Item 4 includes the method of item 3, wherein the forming the first dielectric layer and forming the second dielectric layer are further characterized as forming the first dielectric and the second dielectric layers simultaneously of a same material. Item 5 includes the method of item 1, and further includes forming a first silicide region on the source and a second silicide region on the drain of the logic transistor prior to the forming of the second dielectric layer. Item 6 includes the method of item 5, and further includes: forming a first source/drain adjacent the control gate, a second source/drain adjacent the select gate, and siliciding the first and second source/drains. Item 7 includes the method of item 1, and further includes forming a liner around the dummy gate prior to the forming the sidewall spacer. Item 8 includes the method of item 7, and further includes forming a hard mask over the NVM region and the logic region prior to the removing the first dielectric layer. Item 9 includes the method of item 8, and further includes removing the hard mask from over the NVM region while leaving the hard mask over the logic region prior to removing the first dielectric layer. Item 10 includes the method of item 1, wherein the first material comprises polysilicon. Item 11 includes the method of item 1, wherein: the forming the metal gate comprises removing the dummy gate to form an opening, filling the opening with metal, and performing chemical mechanical polishing. Item 13 includes the method of item 1, wherein the forming the charge storage layer comprises forming a layer of silicon nitride. Item 12 includes the method of item 1, wherein the forming the charge storage layer includes: forming a base dielectric layer; forming nanocrystals on the base dielectric layer; and forming a fill dielectric layer around and over the nanocrystals. Item 13 includes the method of item 1, wherein the forming the charge storage layer comprises forming a layer of silicon nitride.

Item 14 includes a method of forming a non-volatile memory (NVM) cell and a logic transistor using a semiconductor substrate, the method includes: forming a polysilicon select gate over a first thermally-grown oxygen-containing layer, a work-function-setting layer over a high-k dielectric, and a dummy gate over the work-function-setting layer; after forming the first thermally-grown oxygen-containing layer, forming a sidewall spacer around the dummy gate; forming source/drains in the semiconductor substrate adjacent to the dummy gate; forming a dielectric layer around the polysilicon select gate and the dummy gate wherein a top surface of the dielectric layer is substantially aligned with a top surface of the polysilicon select gate and a top surface of the dummy gate; removing the dummy gate; replacing the dummy gate with a metal gate to form a logic gate comprising the work-function-setting material and the metal gate; forming a hard mask over the logic gate; removing the dielectric layer from around the polysilicon select gate while leaving the dielectric layer around the logic gate; forming a charge storage layer over the semiconductor substrate; forming a conductive layer over the charge storage layer; etching the conductive layer to form a control gate over a portion of the charge storage layer and removing the conductive layer from over the hard mask; etching the charge storage layer to leave a portion of the charge storage layer under the control gate and removing the charge storage layer from over the hard mask; and forming second source/drains in the substrate adjacent to the select gate and control gate. Item 15 includes the method of item 14, and further includes removing the hard mask. Item 16 includes the method of item 15, and further includes siliciding the second source/drains prior to the removing the hard mask. Item 17 includes the method of item 16, and further includes siliciding the first source/drains prior to the forming the dielectric layer. Item 18 includes the method of item 14, wherein the forming a charge storage layer comprises forming a nanocrystal-containing charge storage layer.

Item 19 includes a method, the method includes: in an NVM region of the semiconductor substrate, forming a polysilicon select gate of a non-volatile memory (NVM) cell on a first thermally-grown oxygen-containing layer, and in a logic region of a semiconductor substrate, forming a work-function-setting material on a high-k gate dielectric and a polysilicon dummy gate on the work-function-setting material; forming a sidewall spacer around the polysilicon dummy gate and silicided source/drains adjacent the sidewall spacer; forming a dielectric having a top surface that is substantially aligned to a top surface of the polysilicon select gate and a top surface of the polysilicon dummy gate; replacing the polysilicon dummy gate with a metal gate; removing the dielectric from around the polysilicon select gate; forming a charge storage layer over the logic region and the NVM region; forming a conductive layer over the logic region and the NVM region; etching the conductive layer over the NVM region to form a control gate over the charge storage layer and removing the conductive layer from the logic region; etching the charge storage layer to leave the charge storage layer under and aligned with the control gate and to remove the charge storage layer over the logic region; and forming source/drain regions in the substrate in the NVM region adjacent to the control gate and to the polysilicon select gate. Item 20 includes the method of item 19, and further includes: forming a hard mask over the logic region prior to the removing the dielectric from around the polysilicon select gate; siliciding the source/drain regions in the substrate in the NVM region; and removing the hard mask after the siliciding the source/drain regions in the substrate in the NVM region.

What is claimed is:

1. A method of forming an NVM cell and a logic transistor using a semiconductor substrate, comprising:
   in a non-volatile memory (NVM) region, forming over the semiconductor substrate a first thermally-grown oxygen-containing layer, a select gate of a first material, and a first dielectric layer, wherein the select gate is on the first thermally-grown oxygen-containing layer, a top surface of the first dielectric layer is substantially aligned with a top surface of the select gate, and the first dielectric layer has a first opening in which the select gate is present in the first opening;
   in a logic region, after forming the first thermally-grown oxygen-containing layer, forming over the semiconductor substrate a high-k dielectric layer, a work-function-setting layer over the high-k dielectric layer, a dummy gate on the work-function-setting layer, source/drains in the semiconductor substrate, a sidewall spacer around the dummy gate, and a second dielectric layer, wherein a top surface of the second dielectric layer is substantially aligned with a top surface of the dummy gate, and the second dielectric layer has a second opening in which the dummy gate is present in the second opening;
   replacing the dummy gate with a metal gate;
   removing the first dielectric layer in the NVM region while leaving the second dielectric layer in the logic region;
   forming a charge storage layer over the NVM region including over the select gate;
   forming a conductive layer over the charge storage layer;
   etching the conductive layer to form a control gate; and
   etching the charge storage layer to leave a remaining portion of the charge storage layer aligned to the control gate.

2. The method of claim 1, wherein:
   the forming the charge storage layer is further characterized by forming nanocrystals over the second dielectric layer and the metal gate; and
   the etching the charge storage layer is further characterized by removing the charge storage layer over the second dielectric layer and the metal gate.

3. The method of claim 2, wherein:
   the step of forming the conductive layer is further characterized by forming the conductive layer over the logic region; and
   the step of patterning the conductive layer is further characterized by removing the conductive layer over the logic region.

4. The method of claim 3, wherein the forming the first dielectric layer and forming the second dielectric layer are further characterized as forming the first dielectric and the second dielectric layers simultaneously of a same material.

5. The method of claim 1, further comprising forming a first silicide region on the source and a second silicide region on the drain of the logic transistor prior to the forming of the second dielectric layer.

6. The method of claim 5, further comprising:
   forming a first source/drain adjacent the control gate, a second source/drain (66) adjacent the select gate, and siliciding the first and second source/drains.

7. The method of claim 1, further comprising:
   forming a liner around the dummy gate prior to the forming the sidewall spacer.

8. The method of claim 7, further comprising:
   forming a hard mask over the NVM region and the logic region prior to the removing the first dielectric layer.

9. The method of claim 8, further comprising removing the hard mask from over the NVM region while leaving the hard mask over the logic region prior to removing the first dielectric layer.

10. The method of claim 1, wherein the first material comprises polysilicon.

11. The method of claim 1, wherein:
    the forming the metal gate comprises removing the dummy gate to form an opening, filling the opening with metal, and performing chemical mechanical polishing.

12. The method of claim 1, wherein the forming the charge storage layer comprises forming a layer of silicon nitride.

13. The method of claim 1, wherein the forming the charge storage layer comprises:
    forming a base dielectric layer;
    forming nanocrystals on the base dielectric layer; and
    forming a fill dielectric layer around and over the nanocrystals.

14. The method of claim 1, wherein the forming the charge storage layer comprises forming a layer of silicon nitride.

15. A method of forming a non-volatile memory (NVM) cell and a logic transistor using a semiconductor substrate, comprising:
    forming a polysilicon select gate over a first thermally-grown oxygen-containing layer, a work-function-setting layer over a high-k dielectric, and a dummy gate over the work-function-setting layer;
    after forming the first thermally-grown oxygen-containing layer, forming a sidewall spacer around the dummy gate;
    forming source/drains in the semiconductor substrate adjacent to the dummy gate;
    forming a dielectric layer around the polysilicon select gate and the dummy gate wherein a top surface of the dielectric layer is substantially aligned with a top surface of the polysilicon select gate and a top surface of the dummy gate;
    removing the dummy gate;
    replacing the dummy gate with a metal gate to form a logic gate comprising the work-function-setting material and the metal gate;
    forming a hard mask over the logic gate;
    removing the dielectric layer from around the polysilicon select gate while leaving the dielectric layer around the logic gate;
    forming a charge storage layer over the semiconductor substrate;

forming a conductive layer over the charge storage layer;

etching the conductive layer to form a control gate over a portion of the charge storage layer and removing the conductive layer from over the hard mask;

etching the charge storage layer to leave a portion of the charge storage layer under the control gate and removing the charge storage layer from over the hard mask; and forming second source/drains in the substrate adjacent to the select gate and control gate.

16. The method of claim 15, further comprising removing the hard mask.

17. The method of claim 16 further comprising siliciding the second source/drains prior to the removing the hard mask.

18. The method of claim 17 further comprising siliciding the first source/drains prior to the forming the dielectric layer.

19. The method of claim 15, wherein the forming a charge storage layer comprises forming a nanocrystal-containing charge storage layer.

20. A method, comprising:

in an NVM region of the semiconductor substrate, forming a polysilicon select gate of a non-volatile memory (NVM) cell on a first thermally-grown oxygen-containing layer, and in a logic region of a semiconductor substrate, forming a work-function-setting material on a high-k gate dielectric and a polysilicon dummy gate on the work-function-setting material;

forming a sidewall spacer around the polysilicon dummy gate and silicided source/drains adjacent the sidewall spacer;

forming a dielectric having a top surface that is substantially aligned to a top surface of the polysilicon select gate and a top surface of the polysilicon dummy gate;

replacing the polysilicon dummy gate with a metal gate;

removing the dielectric from around the polysilicon select gate;

forming a charge storage layer over the logic region and the NVM region;

forming a conductive layer over the logic region and the NVM region;

etching the conductive layer over the NVM region to form a control gate over the charge storage layer and removing the conductive layer from the logic region;

etching the charge storage layer to leave the charge storage layer under and aligned with the control gate and to remove the charge storage layer over the logic region; and forming source/drain regions in the substrate in the NVM region adjacent to the control gate and to the polysilicon select gate.

21. The method of claim 20 further comprising:

forming a hard mask over the logic region prior to the removing the dielectric from around the polysilicon select gate;

siliciding the source/drain regions in the substrate in the NVM region; and removing the hard mask after the siliciding the source/drain regions in the substrate in the NVM region.

* * * * *